(12) United States Patent
Sakaida et al.

(10) Patent No.: US 6,695,020 B2
(45) Date of Patent: Feb. 24, 2004

(54) FLUID MATERIAL FILLING APPARATUS AND RELATED FILLING METHODS

(75) Inventors: Atushi Sakaida, Nagoya (JP); Toshihisa Taniguchi, Handa (JP)

(73) Assignee: Denso Corporation, Kariya (JP)

(*) Notice: Subject to any disclaimer, the term of this patent is extended or adjusted under 35 U.S.C. 154(b) by 0 days.

(21) Appl. No.: 10/267,714

(22) Filed: Oct. 9, 2002

(65) Prior Publication Data

US 2003/0066572 A1 Apr. 10, 2003

(30) Foreign Application Priority Data

Oct. 10, 2001 (JP) ........................................ 2001-313120
Jun. 14, 2002 (JP) ........................................ 2002-174069

(51) Int. Cl.⁷ .............................................. B65B 1/04
(52) U.S. Cl. .............................. 141/234; 141/4; 141/65; 141/125; 141/280
(58) Field of Search ................................ 141/234, 4, 8, 141/65, 125, 250, 270, 284, 280

(56) References Cited

U.S. PATENT DOCUMENTS 5,467,805 A * 11/1995 Farina ........................... 141/32
5,813,444 A * 9/1998 Cashion ....................... 141/248
6,506,332 B2 * 1/2003 Pedigo ......................... 264/443

FOREIGN PATENT DOCUMENTS

JP 11-186731 7/1999
JP 2000-133937 5/2000
JP 2001-111221 4/2001

* cited by examiner

Primary Examiner—Steven O. Douglas
(74) Attorney, Agent, or Firm—Harness, Dickey & Pierce, PLC

(57) ABSTRACT

A vacuum pump depressurizes a scavenging chamber to discharge the air or gas residing in a via hole. Then, a paste chamber provided adjacent to the scavenging chamber moves on the scavenged via hole. A squeezing unit provided in the paste chamber pushes a conductive paste into the via hole. Keeping the inside space of the via hole in a depressurized condition is effective to let the conductive paste enter deeply into the via hole. The inside space of the via hole is entirely filled with the conductive paste.

26 Claims, 9 Drawing Sheets

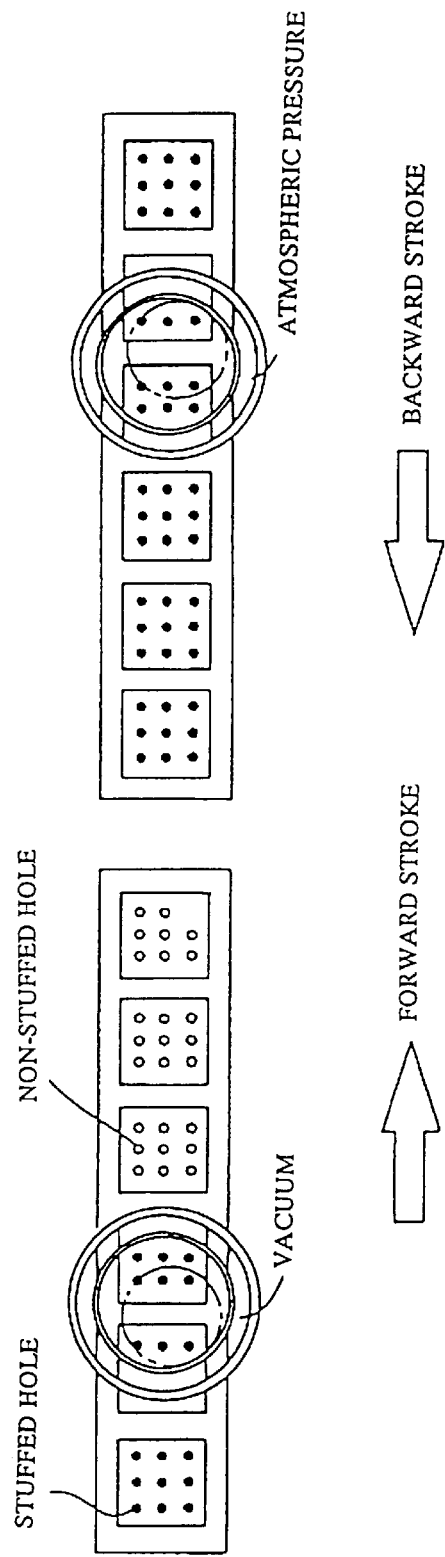

FLUID MATERIAL FILLING APPARATUS AND RELATED FILLING METHODS

BACKGROUND OF THE INVENTION

This invention relates to a fluid material filling apparatus and a fluid material filling method which is capably of stuffing a fluid material not only into a through hole or a shallow closed-end bore but also into a specific closed-end bore having a very small size in diameter and/or depth.

Conventionally, a printed circuit board is provided with via holes formed in an insulating substrate body thereof. A screen printing method is generally used to fill the via holes with a conductive paste serving as a fluid material.

According to a conventional screen printing method for filling the via holes with a conductive paste, a first step is preparing a screen plate with penetration apertures located at predetermined portions corresponding to via holes to be formed. In the next step, the screen plate is placed on the insulating substrate body. Then, the conductive paste is supplied onto the screen plate. Then, the conductive paste on the screen plate is moved or wiped from one end to the other end along a screen surface under the condition that the screen plate is pushed by a squeegee. Thus, under the pressure given by the squeegee, the conductive paste penetrates the penetration apertures and enters into the via holes.

According to the above-described conventional method, it is possible to forcibly push the paste material into a through hole. However, this conventional method is not preferably applicable to via holes with bottoms. For example, when a wiring pattern pad is placed at the bottom of a substrate, via holes opened across the substrate body necessarily have bottoms. In such a case, the residual air in the bottom of each via hole cannot be smoothly replaced by the paste material. Accordingly, undesirable voids of residual air will remain in the bottom of respective via holes. This problem will be severe when the mounting density of electronic elements on a printed circuit board is increased and when the diameter of respective via holes becomes small or when the depth of respective via holes becomes deep.

SUMMARY OF THE INVENTION

In view of the above-described problems, the present invention has an object to provide a fluid material filling apparatus and a fluid material filling method which are capable of sufficiently filling a closed-end hole with a fluid material, and especially capable of supplying the fluid material deeply into the bottom of respective holes formed in a substrate.

In order to accomplish the above and other related objects, the present invention provides a first filling apparatus for filling a hole of a substrate with a fluid material, comprising a scavenging section for forming a first hermetically closed chamber when brought into contact with a substrate surface and for depressurizing the first hermetically closed chamber, a fluid material filling section for forming a second hermetically closed chamber when brought into contact with the substrate surface and for stuffing the fluid material into the hole of the substrate within the second hermetically closed chamber, and shifting means for shifting the second hermetically closed chamber of the fluid material filling section to a position of the hole of the substrate after the hole of the substrate is depressurized in the first hermetically closed chamber of the scavenging section. The second hermetically closed chamber is provided adjacent to the first hermetically closed chamber. The fluid material filling section comprises a supply section for supplying the fluid material onto a substrate surface within the second hermetically closed chamber and a squeezing unit for pushing the fluid material into the hole of the substrate within the second hermetically closed chamber.

According to the above-described first fluid material filling apparatus, the scavenging section depressurizes the first hermetically closed chamber so that the air or gas in the hole positioned in the first hermetically closed chamber is scavenged. Then, the second hermetically closed chamber of the fluid material filling section shifts on the substrate surface so as to arrive on the hole thus depressurized. In this condition, the fluid material filling section pushes the fluid material into the depressurized hole. In this case, as the air or gas in the hole is sufficiently scavenged beforehand, the fluid material surely enters into the hole. The inside space of the hole can be entirely filled with the fluid material.

According to the first fluid material filling apparatus, it is preferable that the squeezing unit causes a motion selected from the group consisting of a rotational motion, an orbital motion, and a swing motion in the second hermetically closed chamber. The rotating or swinging squeezing unit is effective to push the fluid material from different directions. Thus, it becomes possible to surely fill the hole with the fluid material.

According to the first fluid material filling apparatus, it is preferable that the squeezing unit includes a sliding member which slides on the substrate surface. The sliding member can wipe the fluid member supplied on the substrate surface and convey the collected fluid material into the hole.

According to the first fluid material filling apparatus, it is preferable that the sliding member is constituted by a rectangular elastic body inclined with respect to the substrate surface. Positioning the sliding member in an inclined relationship with the substrate surface makes it possible to produce a force for pushing the fluid material into the hole at the given angle. The hole can be sufficiently filled with the fluid material. When the sliding member is made by an elastic body having spilt rectangular portions, each rectangular elastic piece can flexibly respond to the rotation or shifting directional change of the squeezing unit and also can follow the undulation of the substrate surface. The contact between the sliding member and the substrate surface can be appropriately maintained. Accordingly, the sliding member can effectively capture the fluid material supplied on the substrate surface at higher probabilities. Thus, the hole can be surely filled with the fluid material.

According to the first fluid material filling apparatus, it is preferable that the supply section holds the fluid material at a predetermined upper position above the squeezing unit within the second hermetically closed chamber, and supplies the fluid material onto the substrate surface via a clearance between a side wall of the second hermetically closed chamber and the squeezing unit. This arrangement requires no special mechanism for supplying the fluid material because the fluid material surely flows down onto the substrate surface from the upper position above the squeezing unit. Furthermore, when the squeezing unit causes a rotational motion, the rotational movement of the squeezing unit can promote the flow of the fluid material directed toward the substrate surface. In this respect, rotating the squeezing unit is preferable. Especially, when the squeezing unit causes an orbital motion in the second hermetically closed chamber, the clearance between the squeezing unit and the second hermetically closed chamber increases or decreases cyclically. This cyclic change of the clearance between the squeezing unit and the second hermetically closed chamber can produce a pump function for surely moving or pushing the fluid material.

According to the first fluid material filling apparatus, it is preferable that the fluid material filling apparatus further includes a depressurizing device for depressurizing the second hermetically closed chamber. If a significant amount of air or gas remains in the second hermetically closed chamber, the residual air or gas and the fluid material will flow into the hole depressurized in the first hermetically closed chamber at the moment the depressurized hole relocates into the second hermetically closed chamber. This will result in an undesirable filling operation of the fluid material.

According to the first fluid material filling apparatus, it is preferable that the second hermetically closed chamber is depressurized to a lower vacuum level compared with the first hermetically closed chamber. In general, when the second hermetically closed chamber accommodating the fluid material is depressurized to a higher vacuum level, a problem such that a solvent contained in the fluid material promptly evaporates will arise. The fluidity of the fluid material will be worsened. This will waste the fluid material at an earlier timing and necessitate an operator or a worker to get a new fluid material. As a result, consumption of the fluid material will increase. On the other hand, when the second hermetically closed chamber is kept at a moderate vacuum level, it becomes possible to prevent the fluid material from deteriorating and also prevent the air or gas from entering in the hole.

According to the first fluid material filling apparatus, when the substrate has a plurality of holes, it is preferable that the first hermetically closed chamber of the scavenging section and the second hermetically closed chamber of the fluid material filling section cause a shifting motion with respect to the substrate so as to stretch over an entire region including all of the plurality of holes. This makes it possible to easily stuff the fluid material into the plurality of holes of the substrate.

According to the first fluid material filling apparatus, it is preferable that control means is provided for controlling a depressurized condition of the scavenging section and also controlling a shifting condition of the shifting means. The first hermetically closed chamber has an annular shape surrounding the second hermetically closed chamber. The control means shifts the first and second hermetically closed chambers to perform an initial fluid material filling operation for stuffing the fluid material into a hole of the substrate under a condition that the first hermetically closed chamber is depressurized. And then, the control means relieves the depressurized condition of the first hermetically closed chamber and shifts the first and second hermetically closed chambers so as to again move on the hole having been once filled with the fluid material to perform a fluid material refilling operation for stuffing additional fluid material into the hole having been once filled with the fluid material.

When the first hermetically closed chamber of the scavenging section surrounds the second hermetically closed chamber, the first hermetically closed chamber located at the leading side of the second hermetically closed chamber has a function of scavenging the air or gas from the hole. However, the first hermetically closed chamber located at the trailing side of the second hermetically closed chamber has a function of sucking the fluid material out of the hole. The fluid material may peel off a hole surface. To avoid this, a fluid material refilling operation is performed under the condition that the first hermetically closed chamber is kept at a moderate level substantially equivalent to the atmospheric pressure. Thus, it becomes possible to fill the paste until it surely reaches the hole surface.

According to the first fluid material filling apparatus, it is preferable that the control means causes the first and second hermetically closed chambers to shift at a first speed during an initial fluid material filling operation, and then causes the first and second hermetically closed chambers to shift at a second speed higher than the first speed during a fluid material refilling operation.

To form the first and second hermetically closed chambers on the substrate surface, each of the scavenging section and the fluid material filling section has a contact portion brought into contact with the substrate surface. During the fluid material filling operation for filling the hole having a bottom formed in the substrate, the fluid material adheres to the contact portion. During the shifting operation of the first and second hermetically closed chambers, the fluid material adhered to the contact portion is brought into contact or merges with the fluid material in the hole. In this case, the fluid material in the hole is drawn by the fluid material adhered to the contact portion and there is the possibility that the fluid material in the hole may be pulled out of the hole. To solve this problem, increasing the shifting speed of the first and second hermetically closed chambers during the fluid material refilling operation is effective to promptly separate the fluid material in the hole from the fluid material adhered to the contact portion. This surely prevents the fluid material from being pulled out of the hole, and stabilizes the amount of the fluid material in the hole.

During the initial fluid materia filling operation, it is necessary to sufficiently supply the fluid material deeply into the bottom of the hole. To this end, it is desirable to set the shifting speed of the first and second hermetically closed chambers at a relatively slow speed. On the other hand, during the fluid material refilling operation, the hole is almost filled with the fluid material and therefore stabilizing or adjusting the filling amount of the fluid material is important. To this end, it is preferable to supply a small amount of fluid material into the hole by increasing the shifting speed of the first and second hermetically closed chambers.

Furthermore, according to the first fluid material filling apparatus, it is preferable that the fluid material filling apparatus comprises control means for controlling a depressurized condition of the scavenging section and also controlling a shifting condition of the shifting means. The first hermetically closed chamber and the second hermetically closed chamber are aligned next to each other. The control means controls the shifting means so that the first hermetically closed chamber of the scavenging section and the second hermetically closed chamber of the fluid material filling section shift in both forward and backward directions on the substrate. In a forward stroke of the first and second hermetically closed chambers, the control means highly depressurizes the first hermetically closed chamber located at a leading side of the second hermetically closed chamber and sets a shifting speed of the first and second hermetically closed chambers at a first speed. And then, in a backward stroke of the first and second hermetically closed chambers, the control means relieves the depressurized condition of the first hermetically closed chamber located at a leading side or a trailing side of the second hermetically closed chamber and changes the shifting speed of the first and second hermetically closed chambers to a second speed higher than the first speed.

In this manner, it is preferable to arrange the first hermetically closed chamber and the second hermetically closed chamber so as to be positioned next to each other. Maintaining the first hermetically closed chamber of the scavenging section at a highly depressurized condition and shifting the first and second hermetically closed chambers at a lower speed (i.e., first speed) in the forward stroke is effective to sufficiently fill the fluid material into the hole. Furthermore, relieving the depressurized condition of the first hermetically closed chamber and shifting the first and second hermetically closed chambers at a higher speed (i.e., second speed) in the backward stroke is effective to prevent the fluid material in the hole from being pulled out of the hole and also effective to stabilize or adjust the amount of the fluid material in the hole.

The present invention provides a second filling apparatus for filling a plurality of holes of a substrate with a fluid material, comprising a first scavenging section for forming a first hermetically closed chamber when brought into contact with a substrate surface and for depressurizing the first hermetically closed chamber, and a second scavenging section for forming a second hermetically closed chamber when brought into contact with the substrate surface and for depressurizing the second hermetically closed chamber. A fluid material filling section is provided for forming a third hermetically closed chamber between the first and second hermetically closed chambers when brought into contact with the substrate surface and for stuffing the fluid material into the holes of the substrate within the third hermetically closed chamber. A shifting means is provided for shifting the first hermetically closed chamber of the first scavenging section, the second hermetically closed chamber of the second scavenging section, and the third hermetically closed chamber of the fluid material filling section. And, a control means is provided for controlling a depressurized condition of the first and second scavenging sections and also controlling a shifting condition of the shifting means. The fluid material filling section comprises a supply section for supplying the fluid material onto a substrate surface within the third hermetically closed chamber and a squeezing unit for pushing the fluid material into the holes of the substrate within the third hermetically closed chamber. The control means controls a shifting direction of the shifting means so that the first to third hermetically closed chambers shift in both forward and backward directions on the substrate. In a forward stroke of the first to third hermetically closed chambers, the control means depressurizes the first hermetically closed chamber located at a leading side of the third hermetically closed chamber to a first depressurized condition and sets a shifting speed of the first to third hermetically closed chambers at a first speed. And, in a backward stroke of the first to third hermetically closed chambers, the control means depressurizes the second hermetically closed chamber located at a leading side of the third hermetically closed chamber to a second depressurized condition which is relieved than the first depressurized condition and changes the shifting speed of the first to third hermetically closed chambers to a second speed higher than the first speed being set in the forward stroke.

Arranging the first and second hermetically closed chambers at front and rear sides of the third hermetically closed chamber of the fluid material filling section makes it possible to provide an appropriate depressurized space at the leading side of the third hermetically closed chamber of the fluid material filling section in each of the forward and backward strokes, without requiring the shifting assembly consisting of the first to third hermetically closed chambers to change the alining direction.

Then, in the forward stroke, to supply the fluid material deeply into the bottom of each hole, the first hermetically closed chamber is maintained at a highly depressurized condition (i.e., first depressurized condition) and the shifting speed is set to a lower speed (i.e., first speed). This makes it possible to assure a sufficient amount of filling amount.

On the other hand, in the backward stroke, the second hermetically closed chamber is maintained at a moderately depressurized condition (i.e., second depressurized condition) and the shifting speed is set to a higher speed (i.e., second speed). This makes it possible to prevent the fluid material in each hole from being pulled out of the hole when the hole relocates in the second hermetically closed chamber. Then, under the condition that the shifting speed is increased, a small amount of the fluid material is supplied to refill each hole. This effectively prevents the fluid material in each hole from being drawn by the fluid material adhered to the contact portion between each hermetically closed chamber and the substrate surface. Thus, the amount of the fluid material in each hole can be stabilized.

According to the second fluid material filling apparatus, it is preferable that in the forward stroke, the control means depressurizes the second hermetically closed chamber of the second scavenging section located at a trailing side of the third hermetically closed chamber of the fluid material filling section to a third depressurized condition which is relieved than the first depressurized condition. This makes it possible to prevent the fluid material in each hole from being sucked out of the hole by the second scavenging section at the moment each hole relocates in the second hermetically closed chamber. Preferably, the third depressurized condition is substantially equivalent to the atmospheric pressure.

According to the second fluid material filling apparatus, it is preferable that in the backward stroke, the control means depressurizes the first hermetically closed chamber of the first scavenging section located at a trailing side of the third hermetically closed chamber of the fluid material filling section to a fourth depressurized condition which is relieved than the second depressurized condition. This makes it possible to prevent the fluid material in each hole from being sucked out of the hole by the first scavenging section at the moment each hole relocates in the first hermetically closed chamber. Preferably, the fourth depressurized condition is substantially equivalent to the atmospheric pressure.

To accomplish the above and other related objects, the present invention further provides a first filling method for filling a hole of a substrate with a fluid material, comprising a step of forming a first hermetically closed chamber partly defined by a predetermined region of a substrate surface and depressurizing the first hermetically closed chamber, a step of forming a second hermetically closed chamber defined by a predetermined region of the substrate surface and positioned adjacent to the first hermetically closed chamber, a step of supplying the fluid material onto a substrate surface within the second hermetically closed chamber, and a step of shifting the first and second hermetically closed chambers in a direction from the second hermetically closed chamber to the first hermetically closed chamber and pushing the fluid material supplied on the substrate surface by using a squeezing member into a hole of the substrate depressurized in the first hermetically closed chamber when the depressurized hole relocates into the second hermetically closed chamber.

According to the first fluid material filling method, it is preferable that the squeezing member causes a motion selected from the group consisting of a rotational motion, an orbital motion, and a swing motion in the second hermetically closed chamber. The fluid material is held at a predetermined upper position above the squeezing member within the second hermetically closed chamber, and is supplied onto the substrate surface via a clearance between a side wall of the second hermetically closed chamber and the squeezing member. Furthermore, it is preferable that the first fluid material filling method comprises a step of depressurizing the second hermetically closed chamber. The second hermetically closed chamber is depressurized to a lower vacuum level compared with the first hermetically closed chamber.

When the substrate has a plurality of holes, it is preferable that the first and second hermetically closed chambers cause a shifting motion with respect to the substrate so as to stretch over an entire region including all of the plurality of holes, so that the plurality of holes of the substrate are filled with the fluid material.

For example, the first hermetically closed chamber has an annular shape surrounding the second hermetically closed chamber. An initial fluid material filling operation is performed by shifting the first and second hermetically closed chambers to stuff the fluid material into a hole of the substrate depressurized in the first hermetically closed chamber when the depressurized hole relocates into the second hermetically closed chamber. And, a fluid material refilling operation is performed by relieving a depressurized condition of the first hermetically closed chamber to a level substantially equal to the atmospheric pressure and shifting the first and second hermetically closed chambers to stuff additional fluid material into the hole having been once filled with the fluid material under such a relieved pressure condition.

In this case, the first and second hermetically closed chambers are shifted at a first speed during the initial fluid material filling operation, and then the first and second hermetically closed chambers are shifted at a second speed higher than the first speed during the fluid material refilling operation.

Alternatively, the first hermetically closed chamber and the second hermetically closed chamber can be aligned next to each other, and are shifted in both forward and backward directions on the substrate during the step of pushing the fluid material into the depressurized hole of the substrate. In a forward stroke of the first and second hermetically closed chambers, the first hermetically closed chamber located at a leading side of the second hermetically closed chamber is highly depressurized and a shifting speed of the first and second hermetically closed chambers is set to a first speed. And, in a backward stroke of the first and second hermetically closed chambers, the depressurized condition of the first hermetically closed chamber located at a leading side or a trailing side of the second hermetically closed chamber is relieved and the shifting speed of the first and second hermetically closed chambers is set to a second speed higher than the first speed.

Moreover, the present invention provides a second filling method for filling a plurality of holes of a substrate with a fluid material, comprising a step of forming a first hermetically closed chamber partly defined by a predetermined region of a substrate, forming a second hermetically closed chamber partly defined by a predetermined region of the substrate, and a third hermetically closed chamber between the first and second hermetically closed chambers partly defined by a predetermined region of the substrate, a step of supplying the fluid material onto a substrate surface within the third hermetically closed chamber, a step of performing an initial fluid material filling operation for depressurizing the first hermetically closed chamber to a first depressurized condition and shifting the first to third hermetically closed chambers at a first speed in a direction from the third hermetically closed chamber to the first hermetically closed chamber so as to stuff the fluid material on the substrate surface into holes of the substrate depressurized in the first hermetically closed chamber when the depressurized holes relocate into the third hermetically closed chamber, and a step of performing a fluid material refilling operation for depressurizing the second hermetically closed chamber to a second depressurized condition relieved than the first depressurized condition and shifting the first to third hermetically closed chambers in a direction from the third hermetically closed chamber to the second hermetically closed chamber at a second speed higher than the first speed so as to stuff the fluid material on the substrate surface into the holes of the substrate depressurized in the second hermetically closed chamber when the depressurized holes relocate into the third hermetically closed chamber.

According to the second fluid material filling method, it is preferable that, during the initial fluid material filling operation, the second hermetically closed chamber located at a trailing side of the third hermetically closed chamber is depressurized into a third depressurized condition which is relieved than the first depressurized condition.

According to the second fluid material filling method, it is preferable that, during the fluid material refilling operation, the first hermetically closed chamber located at a trailing side of the third hermetically closed chamber is depressurized into a fourth depressurized condition which is relieved than the second depressurized condition.

Their functions and effects of the fluid material filling method are similar to those of the above-described filling apparatus.

BRIEF DESCRIPTION OF THE DRAWINGS

The above and other objects, features and advantages of the present invention will become more apparent from the following detailed description which is to be read in conjunction with the accompanying drawings, in which:

FIG. 4A is a view explaining a conductive paste filling operation in accordance with the first embodiment of the present invention;

FIG. 4B is a view explaining a conductive paste refilling operation in accordance with the first embodiment of the present invention;

DESCRIPTION OF THE PREFERRED EMBODIMENTS

Figure 1:
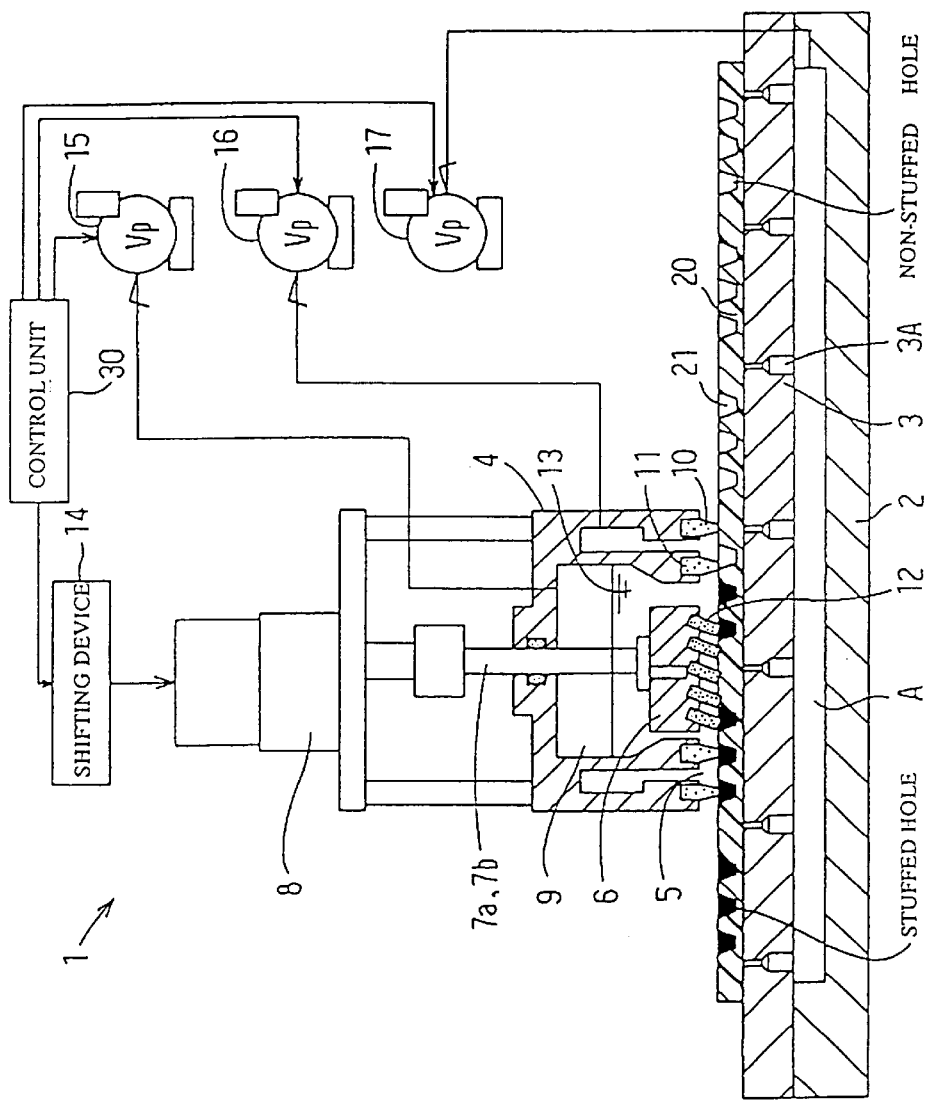
FIG. 1 is a schematic view showing the arrangement of a filling apparatus in accordance with a first embodiment of the present invention.

Preferred embodiments of the present invention will be explained hereinafter with reference to attached drawings. Identical parts are denoted by the same reference numerals throughout the drawings.

Preferred embodiments of the present invention will be explained hereinafter with reference to the attached drawings.

First Embodiment

FIG. 1 is a schematic view showing the arrangement of a filling apparatus for filling a via hole of a resin sheet serving as a substrate with a conductive paste (i.e., fluid material) in accordance with a first embodiment of the present invention.

In FIG. 1, a resin sheet 20 is made of a thermoplastic resin. According to this embodiment, the resin sheet 20 contains a polyether-etherketone resin of 65 to 35 weight % and a polyether-imide resin of 35 to 65 weight %. The resin sheet 20 has a thickness of 25 to 75 $\mu$m. As a usage of this kind of resin sheet, it is possible to form a multilayered substrate by laminating a plurality of resin sheets.

A conductive foil (not shown), such as a copper foil or an aluminum foil, is attached on one surface of the resin sheet 20. The wiring pattern is formed on the resin sheet 20 by patterning this conductive foil.

In the resin sheet 20 having the conductive foil attached on the surface thereof, a plurality of via holes 21 are formed at portions where the interfacial connection is provided. The formation of via holes 21 can be performed prior to the patterning of the conductive foil or after finishing the patterning of the conductive foil. Each via hole 21 is formed by irradiating a carbon dioxide laser on a bare surface of the resin sheet 20 not provided with the conductive foil. The via hole 21 is thus formed as a closed-end via hole having a bottom defined by the conductive foil attached to the resin sheet 20. During the formation of each via hole 21, the irradiation of carbon dioxide laser is finely controlled in both output and time of irradiation so as not to damage the conductive foil. It is however possible to use any appropriate means other than the carbon dioxide laser to form the closed-end via holes 21.

After finishing the formation of via holes 21, a filling apparatus shown in FIG. 1 is used to fill each via hole 21 with a conductive paste 13 serving as an interfacial connecting material. The conductive paste 13 is fabricated by adding copper, silver, tin or comparable metallic grains into a binder resin or an organic solvent and then kneading them into a paste condition. Before the via holes 21 are filled with the conductive paste 13, it is preferable to cover the surface of the resin sheet 20 with a polyethylene-terephthalate or a comparable protecting film. In this case, the carbon dioxide laser is irradiated onto a laminated layer of the protecting film and the resin sheet 20. The via holes 21 are formed in the resin sheet 20, while the corresponding openings are provided on the protecting film. The protecting film is removed off the resin sheet 20 after accomplishing the filling operation with the conductive paste 13. Using the protecting film is effective to maintain the surface of resin sheet 20 clean.

Hereinafter, the filling apparatus 1 in accordance with the first embodiment of the present invention will be explained in detail. As shown in FIG. 1, the filling apparatus 1 has a base 2 for mounting the resin sheet 20. A retainer 3, for holding the resin sheet 20, is provided on the base 2. The base 2 has a recessed portion on the surface thereof. When the retainer 3 is mounted on the base 2, a closed space 'A' is formed between the base 2 and the retainer 3. The retainer 3 has a plurality of suction holes 3A each providing a communicating passage between the closed space 'A' and the outside surface of retainer 3.

When the resin sheet 20 is mounted on the retainer 3, the closed space 'A' defined between the base 2 and the retainer 3 is depressurized by a vacuum pump 17. Under a vacuum thus provided via the plurality of suction holes 3A of the retainer 3, the resin sheet 20 mounted on the retainer 3 is drawn toward the retainer 3. This prevents the resin sheet 20 from floating off the retainer 3 even when a later-described scavenging chamber 5 or a paste chamber 9 is subjected to a suction pressure. The method for holing the resin sheet 20 is not limited to the above-described one. For example, it is possible to securely hold the resin sheet 20 on the base 2 by sandwiching the peripheral edge of the resin sheet 20 between the base 2 and the retainer 3.

The resin sheet 20 with an upper surface, on which the via holes 21 are formed, is placed on the retainer 3 mounted on the base 2. A head 4 of the filling apparatus 1 is put on the resin sheet 20 to perform a filling operation for filling the via holes 21 with the conductive paste 13.

Hereinafter, the arrangement of the head 4 of the filling apparatus 1 will be explained in detail. The head 4 has a cylindrical shape. The head 4 has the paste chamber 9 formed at the center thereof. A scavenging chamber 5, having an annular shape, is provided outside the paste chamber 9. The scavenging chamber 5 surrounds the paste chamber 9. The scavenging chamber 5 is provided adjacent to the paste chamber 9 via a partition wall.

At the opened end side of the scavenging chamber 5, an annular seal member 10 is attached to a lower end of the cylindrical wall defining the scavenging chamber 5. Similarly, at the opened end side of the paste chamber 9, an annular seal member 11 is attached to a lower end of the cylindrical wall defining the paste chamber 9. The annular seal member 10, when brought into contact with the resin sheet 20, provides a hermetically closed space for the scavenging chamber 5. The annular seal member 11, when brought into contact with the resin sheet 20, provides a hermetically closed space for the paste chamber 9. The scavenging chamber 5 is connected to a vacuum pump 16. The paste chamber 9 is connected to a vacuum pump 15. When the seal members 10 and 11 are placed on the resin sheet 20, the scavenging chamber 5 and the paste chamber 9 are hermetically closed. Under this condition, the vacuum pumps 15 and 16 are driven to discharge the air or gas from the scavenging chamber 5 and the paste chamber 9, thereby depressurizing the scavenging chamber 5 and the paste chamber 9.

A squeezing unit 6, serving as a means for pushing the conductive paste 13 into respective holes 21, is shiftably supported in the paste chamber 9. The detailed operation of the squeezing unit 6 is explained with reference to FIGS. 3A to 3C.

Figure 3A:
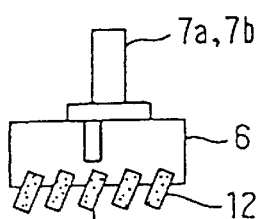
FIG. 3A is a front view showing a squeezing unit of the filling apparatus in accordance with the first embodiment of the present invention.
Figure 3C:
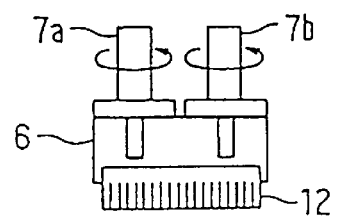
FIG. 3C is a side view showing the squeezing unit of the filling apparatus in accordance with the first embodiment of the present invention.

As shown in FIG. 3A, the squeezing unit 6 has a plurality of sliding members 12 at a surface opposed to the resin sheet 20. Each of the plurality of sliding members 12 is made of an elastic material. As shown in FIG. 3C, the distal end side of the sliding member 12 is split into a plurality of rectangular portions. Each rectangular elastic piece can flexibly respond to the rotation or shifting directional change of the squeezing unit and also can follow the undulation of the substrate surface. The contact between the sliding member 12 and the surface of resin sheet 20 can be appropriately maintained.

Figure 3B:
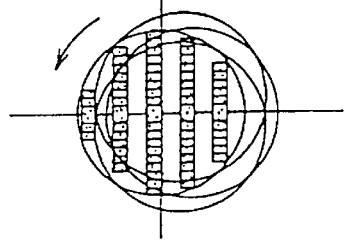
FIG. 3B is a bottom view showing the squeezing unit of the filling apparatus in accordance with the first embodiment of the present invention.

Furthermore, as shown in FIG. 3B, the plurality of sliding members 12 are arrayed parallel to each other. The sliding members 12 are attached to the squeezing unit 6 in such a manner that each sliding member 12 inclines with respect to the surface of resin sheet 20. Positioning each sliding member 12 in an inclined relationship with the substrate surface makes it possible to produce a force for pushing the conductive paste 13 into the via holes 21 at the given angle. The via holes 21 can be sufficiently filled with the conductive paste 13.

The squeezing unit 6, as shown in FIG. 3C, is connected to two rotary shafts 7a and 7b. These rotary shafts 7a and 7b are respectively connected to a rotary drive unit 8 positioned above the head 4. These rotary shafts 7a and 7b rotate in the same direction at the same speed.

Each of the rotary shafts 7a and 7b has an eccentric pin provided at the distal end thereof. The eccentric pins of rotary shafts 7a and 7b are offset in the same direction by the same distance. These eccentric pins are rotatably coupled in the squeezing unit 6. When the rotary shafts 7a and 7b rotate in the same direction, the eccentric pins of shafts 7a and 7b cause a rotational motion about the shafts 7a and 7b, respectively. As the squeezing unit 6 is coupled with the eccentric pins, the squeezing unit 6 itself does not cause a rotational motion about its own axis. Instead, the squeezing unit 6 causes an orbital motion in response to the rotational motion of the eccentric pins.

In this manner, the squeezing unit 6 causes an orbital motion in the paste chamber 9 while each sliding member 12 is held at a predetermined direction. Each sliding member 12 causes an orbital motion in accordance with the movement of the squeezing unit 6. Thus, the conductive paste 13 supplied on the surface of resin sheet 20 is pushed into the via holes 21 from different directions by the sliding members 12. The via holes 21 can be surely filled with the conductive paste 13.

The conductive paste 13 is held at an upper position above the squeezing unit 6 in the paste chamber 9. The conductive paste 13 flows down onto the surface of resin sheet 20 via a clearance between the squeezing unit 6 and the side wall of the paste chamber 9 in accordance with the orbital motion of the squeezing unit 6. In other words, the this embodiment requires no special mechanism for supplying the conductive paste 13 on the surface of resin sheet 20 because the conductive paste 13 surely flows down onto the substrate surface from the upper position above the squeezing unit 6. Furthermore, when the squeezing unit 6 causes an orbital motion, the clearance between the squeezing unit 6 and the side wall of the paste chamber 9 increases or decreases cyclically. This cyclic change of the clearance between the squeezing unit 6 and the side wall of the paste chamber 9 can produce a pump function for surely moving or pushing the conductive paste 13 on the surface of resin sheet 20. The flowing amount of conductive paste 13 is adjustable by adequately changing the clearance between the squeezing unit 6 and the side wall of the paste chamber 9.

A shifting device 14 is provided to shift the head 4 and the drive unit 8 in an extensive region including all of the plurality of via holes 21 formed on the resin sheet 20. For example, the shifting device 14 has a robot arm or includes a traveling section traveling on X-axis and Y-axis rails. When the head 4 and the drive unit 8 are mounted on the traveling section, it is possible to easily locate the head 4 and the drive unit 8 to an intended position in the region including all of the via holes 21. Alternatively, the shifting device 14 may be provided as a means for shifting the base 2 and the retainer 3 in the X-axis and the Y-axis for moving the resin sheet 20 with respect to the head 4 and the drive unit 8. In short, the shifting device 14 does not restrict the shifting object and therefore can be modified in various ways as far as it has a function of causing a relative movement between the head 4 and the resin sheet 20.

Furthermore, the filling apparatus 1 includes a control unit 30. The control unit 30 outputs a control signal to the shifting device 14 to control a shifting direction and a shifting speed of the head 4 and the drive unit 8. Furthermore, the control unit 30 outputs control signals to respective vacuum pumps 15 to 17 to control depressurized conditions of the paste chamber 9, the scavenging chamber 5, and the space 'A' defined between the base 2 and retainer 3.

The above-described filling apparatus 1 has the following functions.

First, the seal members 10 and 11 attached to the head 4 are put on the resin sheet 20 mounted on the retainer 3. Under this condition, the vacuum pump 16 discharges the air or gas from the scavenging chamber 5 to depressurize the scavenging chamber 5 to a predetermined higher vacuum level (e.g., 0.01 Mpa or less). Similarly, the vacuum pump 15 discharges the air or gas from the paste chamber 9 to depressurize the paste chamber 9 to a predetermined moderate vacuum level (e.g., 0.06 Mpa) which is relieved than the vacuum level of the scavenging chamber 5.

Next, the shifting device 14 shifts the head 4 along the upper surface of the resin sheet 20 while the squeezing unit 6 causes an orbital motion in the paste chamber 9. The shifting region of the head 4, when shifted by the shifting device 14, stretches over an entire region including all of the plurality of via holes 21 opened on the upper surface of resin sheet 20. Accordingly, when the head 4 shifts over an arbitrary via hole 21, this via hole 21 first enters into the scavenging chamber 5 positioned at a radially outer side of the head 4. The residual air or gas in the via hole 21 is discharged by the vacuum pump 16. Thereafter, as the head 4 advances in the same direction, the via hole 21 thus depressurized in the scavenging chamber 5 next enters into the paste chamber 9. The sliding member 12 of squeezing unit 6 wipes the conductive paste 13 supplied on the resin sheet 20 and conveys the collected paste into the via hole 21. In this case, as the residual air or gas in the via hole 21 is discharged beforehand, the sliding member 12 can smoothly and surely push the conductive paste 13 into the via hole 21. Hence, the inside space of the via hole 21 is entirely filled with the conductive paste 13.

This embodiment depressurizes not only the scavenging chamber 5 but also the paste chamber 9 by the following reasons.

If only the scavenging chamber 5 is depressurized, each via hole 21 in a depressurized condition will be subjected to the air or gas remaining in the paste chamber 9 as soon as the via hole 21 relocates into the paste chamber 9. In this case, the conductive paste 13 containing a significant amount of air or gas will enter the via hole 21, resulting in a dissatisfactory conductive paste filling operation. This is the reason why this embodiment depressurizes the paste chamber 9.

However, when the paste chamber 9 is depressurized, it is important that the paste chamber 9 is maintained at the moderate vacuum level relieved than that of the scavenging chamber 5. If the vacuum level of the paste chamber 9 is set to a higher level, there will be the possibility that the solvent contained in conductive paste promptly evaporates and as a result the quality of conductive paste 13 is worsened.

Figure 2:
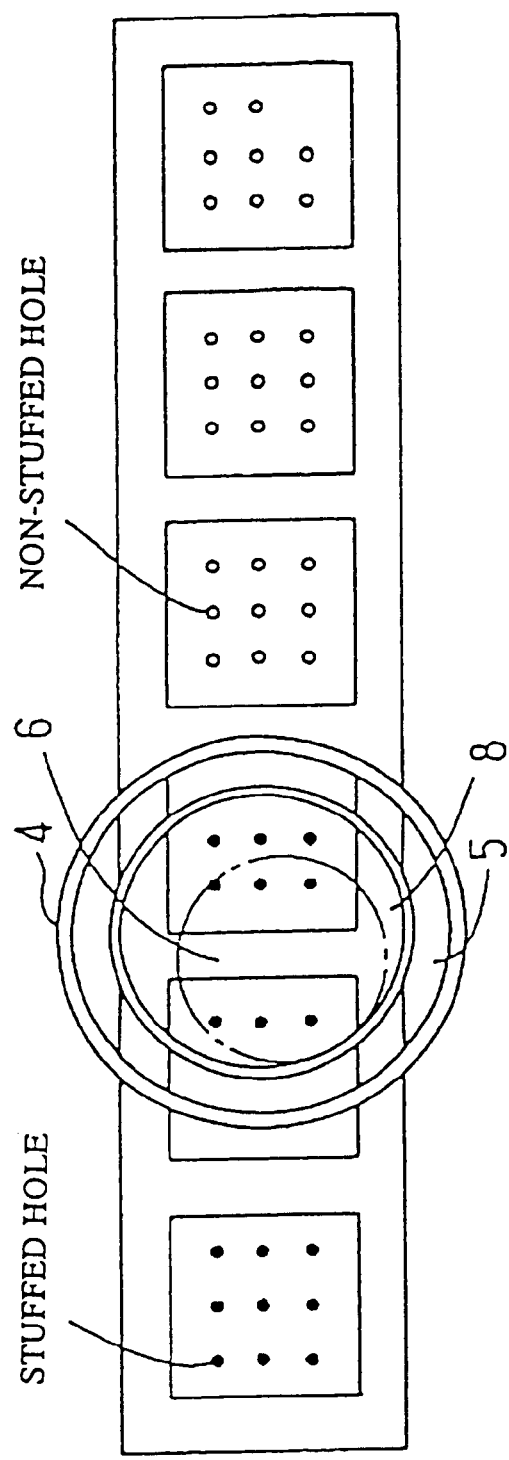
FIG. 2 is a view explaining a filling operation performed by the filling apparatus to fill each via hole with a conductive paste in accordance with the first embodiment of the present invention.

FIG. 2 illustrates the filling operation for filling each via hole 21 with the conductive paste 13, although FIG. 2 shows only a part of the resin sheet 20.

The head 4 moves along the region including all of the via holes 21. When the head 4 is positioned on each via hole 21, the residual air or gas is first discharged out of the via hole 21 and then the conductive paste 13 is stuffed into the via hole 21. According to this embodiment, the scavenging chamber 5 has an annular shape so as to surround the paste chamber 9. Therefore, there is the possibility that, even if the conductive paste filling operation is successfully accomplished in the paste chamber 9, the conductive paste 13 may be sucked out of the via hole 21 when the stuffed conductive paste 13 relocates into the scavenging chamber 5 positioned at the trailing side of the paste chamber 9. In this case, the stuffed conductive paste 13 will be partly removed from the surficial side of the via hole 21. This will result in a dissatisfactory conductive paste filling operation.

Considering this drawback, this embodiment performs a refilling operation in addition to the initial filling operation. More specifically, as shown in FIG. 4A, the head 4 is moved along the entire region including all of the via holes 21 to fill each via hole 21 with the conductive paste 13 under the condition that the scavenging chamber 5 is depressurized to a predetermined higher vacuum level. Subsequently, as shown in FIG. 4B, the head 4 is returned to refill the via hole 21 with additional conductive paste 13 under the condition that the scavenging chamber 5 is relieved to a level substantially equivalent to the atmospheric pressure (e.g., 0.1 Mpa).

Adding the refilling operation is effective to surely fill the entire space including the surficial side of the via hole 21 with the conductive paste.

Furthermore, it is preferable that the shifting speed of the head 4 during the conductive paste refilling operation is higher than the shifting speed of the head 4 during the initial filling operation. For example, the shifting speed of the head 4 during the initial filling operation is set to somewhere in a range from 30 to 60 mm/sec, while the shifting speed of the head 4 during the refilling operation is set to somewhere in a range from 90 to 160 mm/sec.

According to the arrangement of the first embodiment, the seal members 10 and 11 are brought into contact with the resin sheet 20 to form the hermetically closed scavenging chamber 5 and the paste chamber 9. In this case, it is inevitable that the conductive paste 13 supplied on the surface of resin sheet 20 or the conductive paste 13 in the surficial region of the via hole 21 adheres to the seal members 10 and 11. The seal members 10 and 11 with the conductive paste 13 adhered thereto slide on the surface of resin sheet 20. This makes a chance that the conductive paste 13 adhered to the seal members 10 and 11 contacts or merges with the conductive paste 13 already stuffed in the via hole 21. The conductive paste 13 in the via hole 21 may be drawn toward the conductive paste 13 adhered to the seal members 10 and 11. As a result, the stuffed conductive paste 13 may be pulled out of the via hole 21. This will result in the shortage of the stuffed conductive paste 13 in the via hole 21.

To solve this problem, the shifting speed of the head 4 during the refilling operation is set to a predetermined higher level so that the conductive paste 13 stuffed in the via hole 21 can promptly separate from the conductive paste 13 adhered to the seal members 10 and 11 before the already stuffed conductive paste 13 is pulled out of the via hole 21 by the conductive paste 13 adhered to the seal members 10 and 11. This surely prevents the shortage of the conductive paste 13 stuffed into each via hole 21. Thus, it becomes possible to completely fill each via hole 21 with the conductive paste 13.

In the initial conductive paste filling operation, it is necessary to surely supply the conductive paste 13 deeply into the bottom of each via hole 21. Thus, it is preferable that the shifting speed of the head 4 during the initial conductive paste filling operation is set to a relatively small value.

Second Embodiment

The filling apparatus in accordance with a second embodiment will be explained with reference to FIGS. 5 and 6. The components or portions identical with those disclosed in the first embodiment are denoted by the same reference numerals and will not be explained in this embodiment.

The above-described first embodiment is characterized in that the scavenging chamber 5 has an annular shape surrounding the paste chamber 9. This arrangement induces the problem that the conductive paste 13 in the surficial region of each via hole 21 may be removed when the via hole 21 relocates into the scavenging chamber 5 positioned at the trailing side of the paste chamber 9, as described above.

To solve this problem, the second embodiment of the present invention provides a filling apparatus having the scavenging chamber 5 which is entirely offset to the leading side of the paste chamber 9. This surely prevents the conductive paste having been once stuffed in the via hole 21 from being removed undesirably.

Figure 5:
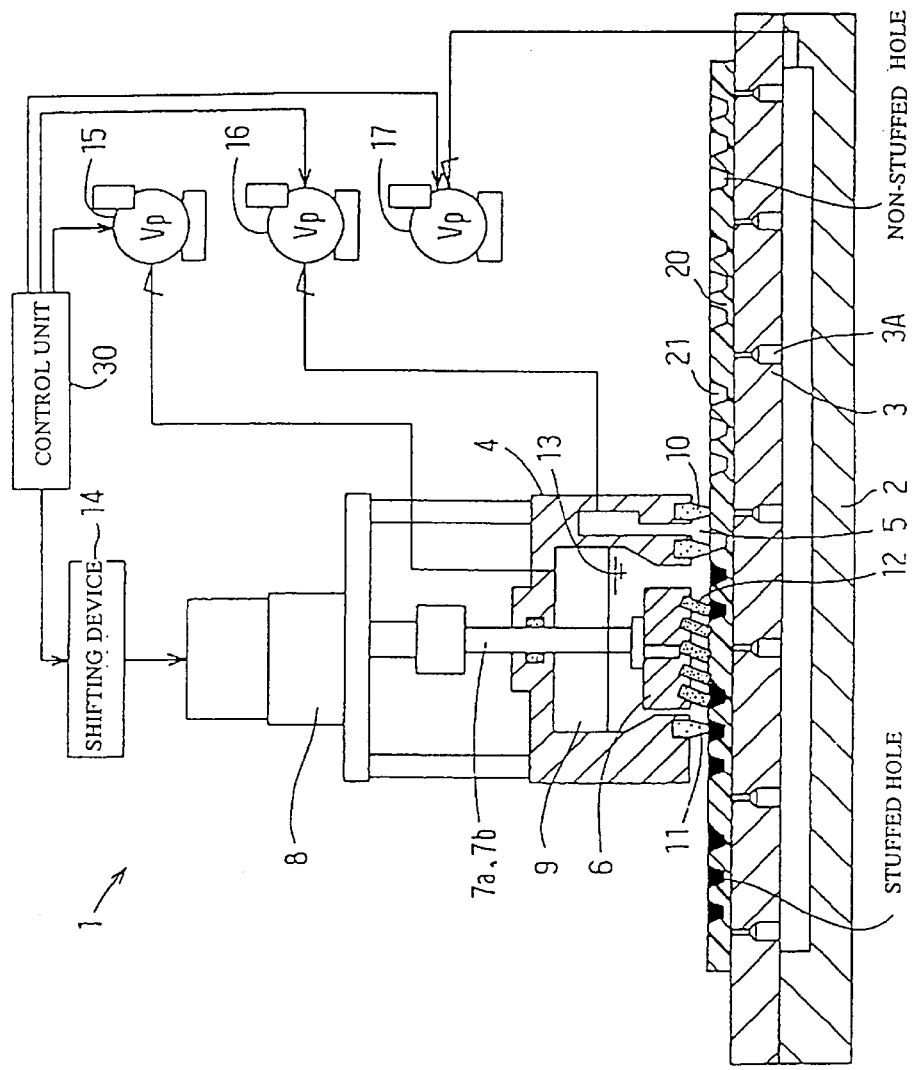
FIG. 5 is a schematic view showing the arrangement of a filling apparatus in accordance with a second embodiment of the present invention.
Figure 6:
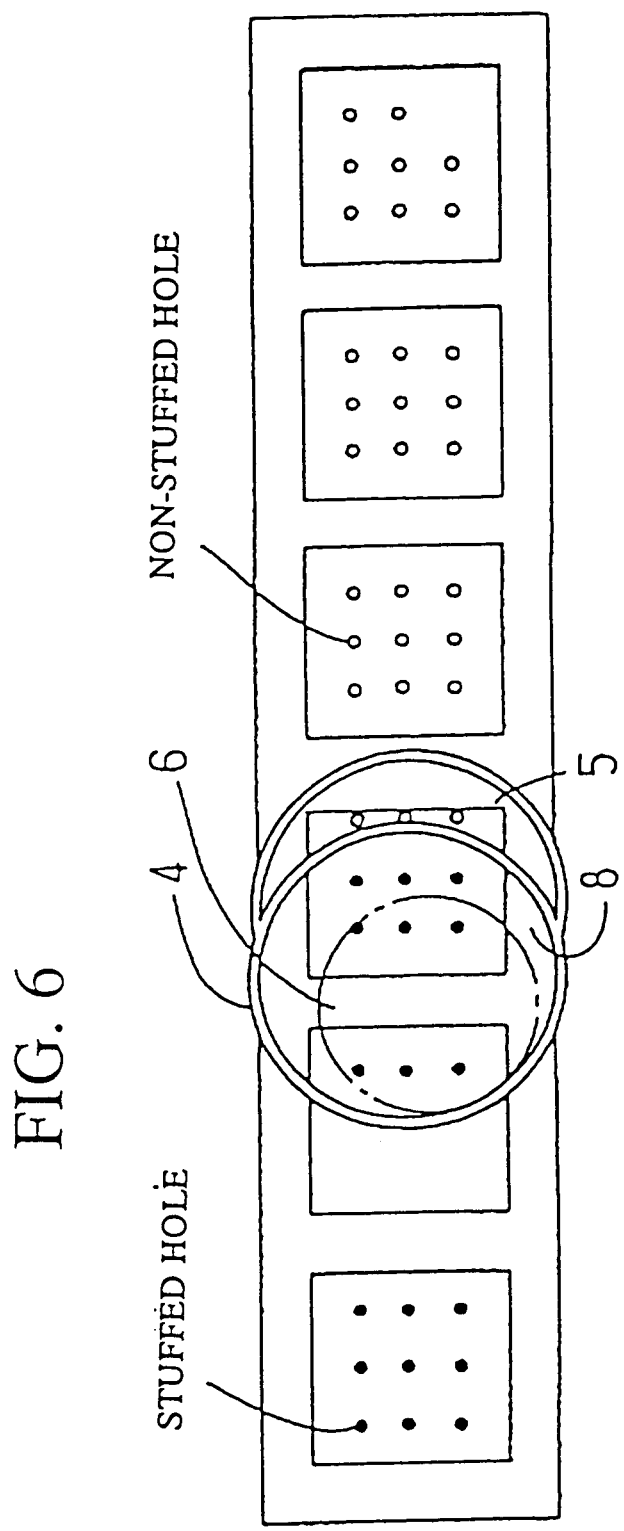
FIG. 6 is a view explaining a filling operation performed by the filling apparatus to fill each via hole with a conductive paste in accordance with the second embodiment of the present invention.

More specifically, as shown in FIGS. 5 and 6, the scavenging chamber 5 has a semi-cylindrical wall connected to the cylindrical surface of the paste chamber 9. In this illustration shown in FIG. 6, the head 4 shifts to the right direction during an initial filling operation. The scavenging chamber 5 is entirely located at the right side of the paste chamber 9. The seal member 11, having an annular shape, forms a hermetical space for the paste chamber 9. The seal member 10, having a semi-circular shape, cooperates with a leading side of seal member 11 to form a hermetical space for the scavenging chamber 5.

Like the above-described first embodiment, it is preferable in the second embodiment to perform the conductive paste refilling operation in addition to the initial conductive paste filling operation. Namely, the via hole 21 is once filled with the conductive paste 13. And then, at a later timing, the stuffed via hole 21 is refilled with additional conductive paste 13. This makes it possible to completely fill each via hole 21 with the conductive paste 13.

The initial filling operation and the succeeding refilling operation are performed in the following manner.

First of all, in the initial filling operation, the vacuum pump 16 discharges the air or gas from the scavenging chamber 5 to depressurize the scavenging chamber 5 to a predetermined higher vacuum level (e.g., 0.01 Mpa or less). Similarly, the vacuum pump 15 discharges the air or gas from the paste chamber 9 to depressurize the paste chamber 9 to a predetermined moderate vacuum level (e.g., 0.06 Mpa) which is relieved than the vacuum level of the scavenging chamber 5. Next, under the above-described depressurized conditions, the shifting device 14 shifts the head 4 along the upper surface of the resin sheet 20 while the squeezing unit 6 causes an orbital motion in the paste chamber 9. The head 4 continuously moves on the resin sheet 20 in a predetermined direction to fill each via hole 21 with the conductive paste 13 opened on the resin sheet 20.

Next, in the succeeding refilling operation, the shifting direction of the head 4 is reversed to refill the already stuffed via hole 21 with additional conductive paste 13. In this case, it is possible to reverse the direction of the head 4 so that the scavenging chamber 5 is positioned at the leading side of the paste chamber 9. In other words, the scavenging chamber 5 is always positioned at the leading side of the paste chamber 9 in each of the forward stroke for the initial filling operation and the backward stroke for the refilling operation. Alternatively, it is also possible to leave the position of the head 4 unchanged, although the scavenging chamber 5 is positioned at the trailing side of the paste chamber 9 in the backward stroke.

In any case, the depressurized condition of the scavenging chamber 5 in the refilling operation is changed to a level substantially equal to the atmospheric pressure (e.g., 0.1 Mpa) which is fairly relieved than the high vacuum level in the initial filling operation. This effectively prevents the already stuffed conductive paste 13 from being pulled out of the via hole 21.

Furthermore, like the first embodiment, it is preferable that the shifting speed of the head 4 during the conductive paste refilling operation is higher than the shifting speed of the head 4 during the initial filling operation. This effectively prevents the already stuffed conductive paste 13 from being pulled out of the via hole 21 by the conductive paste 13 adhered to the seal members 10 and 11. Each via hole 21 can be completely filled with the conductive paste 13.

Third Embodiment

The filling apparatus in accordance with a third embodiment will be explained with reference to FIGS. 7 and 8. The components or portions identical with those disclosed in the first embodiment are denoted by the same reference numerals and will not be explained in this embodiment.

The above-described first embodiment is characterized in that the scavenging chamber 5 has an annular shape surrounding the paste chamber 9. The filling apparatus in accordance with the third embodiment is characterized in that the scavenging chamber 5 is separated into two independent chambers and positioned at opposite sides of the paste chamber 9. Hereinafter, the filling apparatus in accordance with the third embodiment will be explained in more detail.

Figure 7:
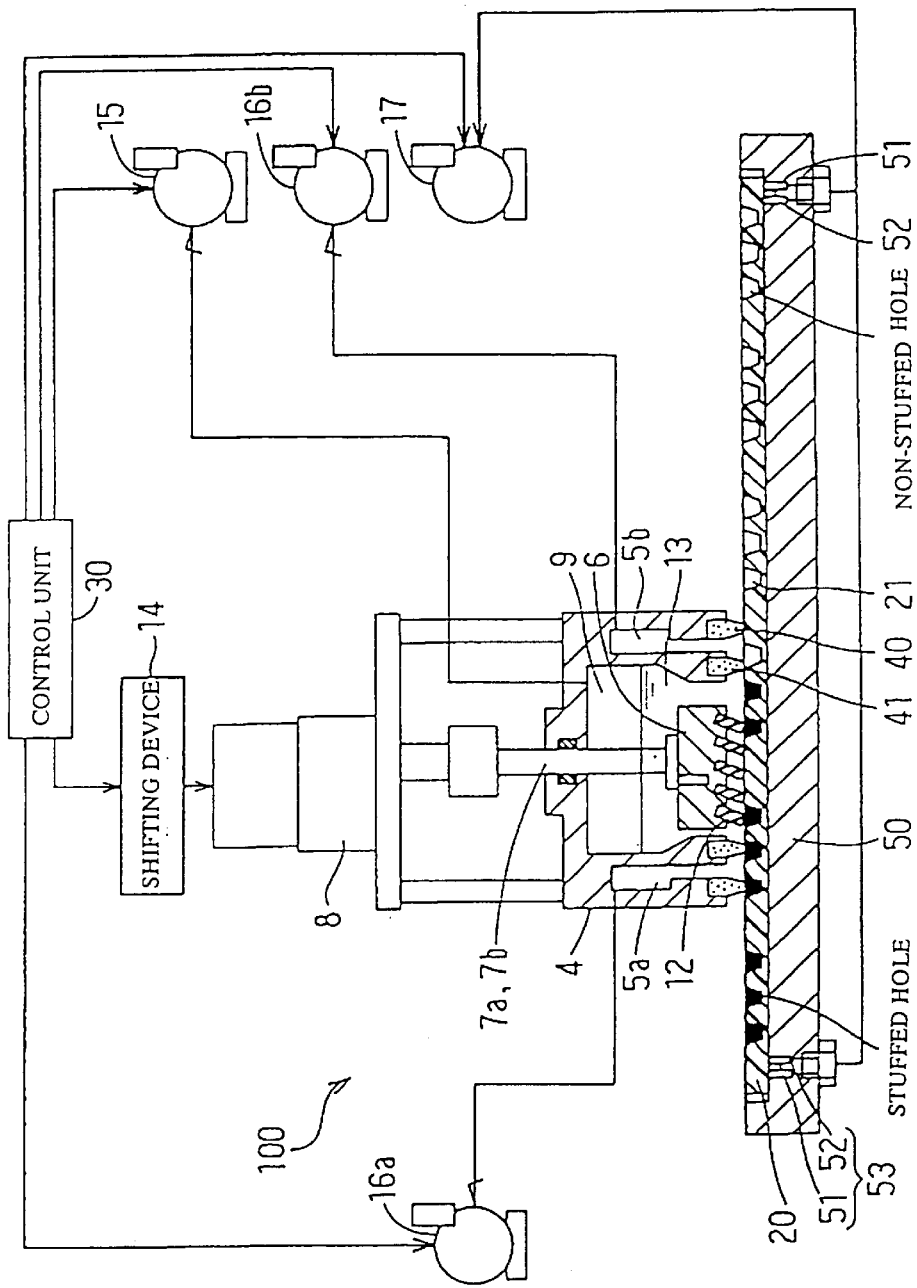
FIG. 7 is a schematic view showing the arrangement of a filling apparatus in accordance with a third embodiment of the present invention.
Figure 8:
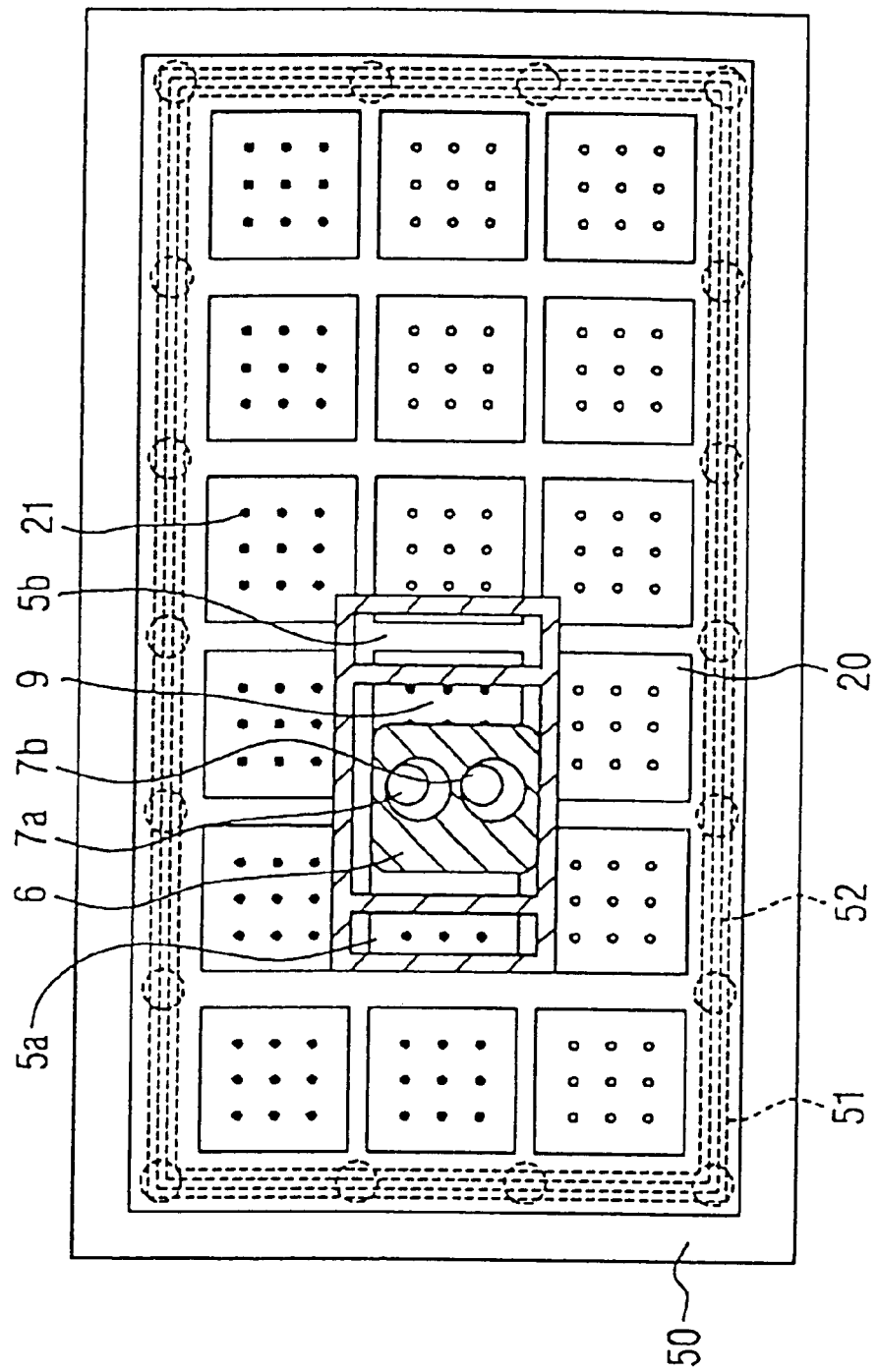
FIG. 8 is a view explaining a filling operation performed by the filling apparatus to fill each via hole with a conductive paste in accordance with the third embodiment of the present invention.

As shown in FIGS. 7 and 8, the filling apparatus 100 has a sheet retainer 50 on which the resin sheet 20 is mounted. The sheet retainer 50 has two, outer and inner, grooves 51 and 52 which cooperatively serve as a suction port 53 for securely holding the resin sheet 20. The grooves 51 and 52 extend along the rectangular periphery of the resin sheet 20 where no via holes 21 are provided. In other words, the grooves 51 and 52 are similar closed grooves positioned adjacent to each other and extending in a rectangular shape.

After the resin sheet 20 is mounted on the sheet retainer 50, the vacuum pump 17 discharges via the suction port 53 the residual air in the space between the resin sheet 20 and the sheet retainer 50. As a result, a suction pressure caused by the vacuum pump 17 acts on the confronting surfaces of the resin sheet 20 and the retainer 50 at the region surrounded by the grooves 51 and 52. The vacuum level at the suction port 53 is equal to or higher than the vacuum level in respective scavenging chambers 5a and 5b. Through this suction operation, the resin sheet 20 is fixed by the suction pressure applied from the outer groove 51. Meanwhile, the suction pressure applied from the inner groove 52 ensures the fixation of the resin sheet 20 in the inner region offset inward from the outer groove 52.

As described above, the vacuum level of inner and outer grooves 51 and 52 is equal to or higher than that of the scavenging chambers 5a and 5b. As a result, the suction pressure equivalent to the vacuum level of inner and outer grooves 51 and 52 acts on the confronting surfaces of the resin sheet 20 and the retainer 50 at the region surrounded by the grooves 51 and 52. Accordingly, even if the depressurized scavenging chambers 5a and 5b cause a force for pealing or separating the resin sheet 20 off the sheet retainer 50, the resin sheet 20 is securely fixed on the sheet retainer 50 because a more higher suction pressure acts on the bottom of the resin sheet 20. Thus, the resin sheet 20 does not float off the sheet retainer 50.

The suction port 53, when a suction pressure is available, holds the outer periphery of the resin sheet 20. The sheet retainer 50 has a flat surface for supporting the behind surface of resin sheet 20 in the region where the via holes 21 are formed. Hence, when the resin sheer 20 is mounted on the sheet retainer 50, the via holes 21 is not deformed. It becomes possible to adequately perform the operation for filling the via holes 21 with the conductive paste 13.

In this manner, the resin sheet 20 with an upper surface, on which the via holes 21 are opened, is placed on the sheet retainer 50. The head 4 of the filling apparatus 100 is put on the resin sheet 20 to perform a filling operation for stuffing the conductive paste 13 into the via holes 21.

Hereinafter, the arrangement of the head 4 of the filling apparatus 100 will be explained in detail. As shown in FIG. 8, the head 4 has a rectangular box shape. The head 4 has the paste chamber 9 formed at the center thereof. Two independent scavenging chambers 5a and 5b are provided at opposite sides of the paste chamber 9.

At the opened end side of the scavenging chambers 5a and 5b, a seal member 40 is attached to a lower end of the rectangular box wall defining each of the scavenging chambers 5a and 5b. Similarly, at the opened end side of the paste chamber 9, a seal member 41 is attached to a lower end of the rectangular box wall defining the paste chamber 9. The seal member 40, when brought into contact with the resin sheet 20, provides a hermetically closed space for each of the scavenging chambers 5a and 5b. The seal member 41, when brought into contact with the resin sheet 20, provides a hermetically closed space for the paste chamber 9. The paste chamber 9 is connected to a vacuum pump 15. The scavenging chamber 5a is connected to a vacuum pump 16a. The scavenging chamber 5b is connected to a vacuum pump 16b. When the seal members 40 and 41 are placed on the resin sheet 20, the scavenging chambers 5a and 5b and the paste chamber 9 are hermetically closed. Under this condition, the vacuum pumps 15, 16a and 16b are driven to discharge the air or gas from the scavenging chambers 5a and 5b as well as from the paste chamber 9, thereby depressurizing the scavenging chambers 5a and 5b and the paste chamber 9.

The squeezing unit 6, having the same arrangement as that explained in the first embodiment, is shiftably supported in the paste chamber 9.

The above-described filling apparatus 100 performs the initial filling operation and the succeeding refilling operation for filling each via hole 21 with the conductive past 13 in the following manner.

First of all, in the initial filling operation, the vacuum pump 16b discharges the air or gas from the scavenging chamber 5b positioned at a leading side of the head 4 to depressurize the scavenging chamber 5b to a predetermined higher vacuum level (−0.01 Mpa or less, for example −0.1 Mpa). Similarly, the vacuum pump 15 discharges the air or gas from the paste chamber 9 to depressurize the paste chamber 9 to a predetermined moderate vacuum level (e.g., −0.06 Mpa) which is relieved than the vacuum level of the scavenging chamber 5b. In this case, the other scavenging chamber 5a positioned at the trailing side of the head 4 is maintained at a predetermined level (e.g., 0.1 Mpa) equivalent to the atmospheric pressure.

Under the above-described depressurized conditions, the shifting device 14 shifts the head 4 along the upper surface of the resin sheet 20 in a predetermined direction while the squeezing unit 6 causes an orbital motion in the paste chamber 9. The shifting speed of the head 4 during this forward stroke is set to an appropriate value in a range from 30 to 60 mm/sec with reference to the depth, layout, and total number of via holes 21. Accordingly, while the head 4 slides on the resin sheet 20 in one direction, each via hole 21 opened on the resin sheet 20 is filled with the conductive paste 13.

When the head 4 reaches the remote end of the resin sheet 20, the shifting direction of the head 4 is reversed to perform the refilling operation in the backward stroke. Namely, the already stuffed via holes 21 are again filled with the conductive paste 13.

During the initial filling operation, to supply a sufficient amount of conductive paste 13 to each via hole 21, the shifting speed of the head 4 was set to a relatively slower value. In this case, however, there is the possibility that the conductive paste 13 in the upper layer of the via hole 21 may be pulled out by the conductive paste 13 adhered to the seal members 40 and 41.

Hence, the shifting speed of the head 4 during the refilling operation is set to a higher value compared with the shifting speed during the initial filling operation. For example, the shifting speed is set to somewhere in the range from 90 to 160 mm/sec and is adjusted with reference to the amount or composition of the conductive paste 13 to be stuffed. With this settings, even if the conductive paste 13 adhered to the seal members 40 and 41 contacts or merges with the already stuffed conductive paste 13 in the via hole 21, it becomes possible to promptly separate them before the already stuffed conductive paste 13 is pulled out of the via hole 21 by the conductive paste 13 adhered to the seal members 40 and 41. Thus, performing the refilling operation makes it possible to completely fill each via hole 21 with the conductive paste 13.

During the refilling operation, the vacuum pump 16a depressurizes the scavenging chamber 5a positioned at the leading side of the head 4 to a moderate vacuum level (e.g., −0.06 Mpa) which is relieved than the higher vacuum level during the initial filling operation. Setting the vacuum level of the scavenging chamber 5a to a moderate vacuum level makes it possible to discharge the air from the upper layer of the via hole 21 while preventing the conductive paste 13 from boiling and also preventing the conductive paste 13 from being pulled out of the via hole 21. The squeezing unit 6 supported in the paste chamber 9 supplies additional conductive paste 13 into the via hole 21 so as to eliminate the shortage of conductive paste 13. In this case, the scavenging chamber 5b positioned at the trailing side of the head 4 is changed to a level substantially equivalent to the atmospheric pressure (e.g., 0.1 Mpa).

Fourth Embodiment

Figure 9A:
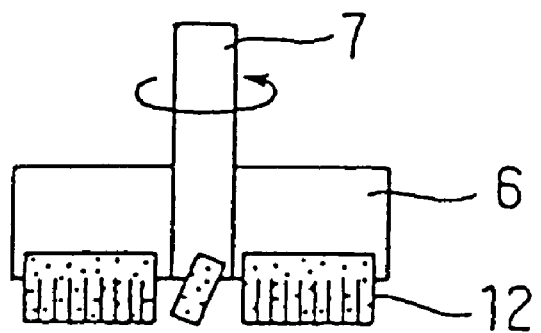
FIG. 9A is a front view showing a squeezing unit of the filling apparatus in accordance with a fourth embodiment of the present invention.
Figure 9B:
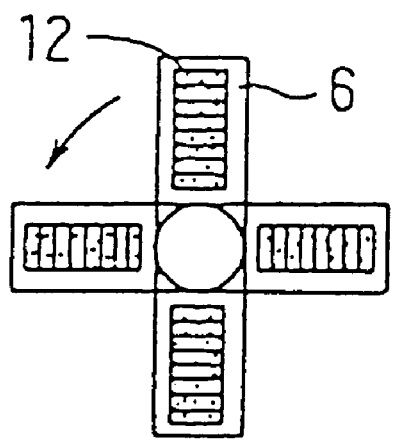
FIG. 9B is a bottom view showing the squeezing unit of the filling apparatus in accordance with the fourth embodiment of the present invention.

Next, a fourth embodiment of the present invention will be explained with reference to FIGS. 9A and 9B.

The above-described first embodiment is characterized in that two rotary shafts 7a and 7b are used to cause the squeezing unit 6 causes an orbital motion in the paste chamber 9.

The fourth embodiment is characterized in that the squeezing unit 6 causes a rotational motion about its own axis. More specifically, as shown in FIGS. 9A and 9B, the squeezing unit 6 according to the fourth embodiment has a single rotary shaft 7 with a cross-shaped rotary vane attached at its distal end. The sliding member 12 having a rectangular elastic body is attached to each vane of the squeezing unit 6. The sliding member 12 is inclined with respect to the surface of resin sheet 20.

Constituting the squeezing unit 6 equipped with the sliding member 12 so as to cause a rotational motion about its own axis during the shifting movement of the head 4 is effective to surely push the conductive paste 13 into each via hole 21 from different directions. Thus, the inside space of each via hole 21 can be completely filled with the conductive paste 13, without leaving any void or crack.

Modified Embodiment

According to the above-described first and second embodiments, the paste chamber 9 is configured into a cylindrical shape. However, the shape of the paste chamber 9 can be modified into a rectangular one as explained in the third embodiment or can be changed into other polygonal shape. Especially, when the paste chamber 9 is configured into a rectangular box shape as explained in the third embodiment, it is preferable to configure the squeezing unit 6 to have a rectangular body so that the squeezing unit 6 can cause an orbital motion in the paste chamber 9. In this case, it becomes possible to surely supply a sufficient amount of conductive paste 13 into the via holes 21 located near the periphery of the resin sheet 20.

Furthermore, it is possible to constitute the squeezing unit 6 so as to perform a swing motion instead of performing an orbital motion or a rotational motion. In this case, it is also preferable that squeezing unit 6 causes a complex motion as a combination of these motions, instead of performing only one of these motions.

Furthermore, the above-described embodiments are the filling apparatus and method for filling the via holes of a resin sheet with the conductive paste. The resin sheet constitutes a part of a multilayered substrate. However, a metal or other material can be used as a substrate to which the present invention can be applied. The use of this invention is not limited to an insulating substrate. Accordingly, the filling apparatus and method of the present invention can be widely applied to any substrate with a hole or holes to be filled with a fluid material.

What is claimed is:

1. A filling apparatus for filling a hole of a substrate with a fluid material, comprising:

a scavenging section for forming a first hermetically closed chamber when brought into contact with a substrate surface and for depressurizing said first hermetically closed chamber;

a fluid material filling section for forming a second hermetically closed chamber when brought into contact with said substrate surface and for stuffing said fluid material into the hole of said substrate within said second hermetically closed chamber; and shifting means for shifting said second hermetically closed chamber of said fluid material filling section to a position of said hole of the substrate after said hole of the substrate is depressurized in said first hermetically closed chamber of said scavenging section, wherein said second hermetically closed chamber is provided adjacent to said first hermetically closed chamber, said fluid material filling section comprises a supply section for supplying said fluid material onto a substrate surface within said second hermetically closed chamber and a squeezing unit for pushing said fluid material into the hole of said substrate within said second hermetically closed chamber.

2. The fluid material filling apparatus in accordance with claim 1, wherein said squeezing unit causes a motion selected from the group consisting of a rotational motion, an orbital motion, and a swing motion in said second hermetically closed chamber.

3. The fluid material filling apparatus in accordance with claim 1, wherein said squeezing unit includes a sliding member which slides on said substrate surface.

4. The fluid material filling apparatus in accordance with claim 3, wherein said sliding member is constituted by a rectangular elastic body inclined with respect to said substrate surface.

5. The fluid material filling apparatus in accordance with claim 1, wherein said supply section holds said fluid material at a predetermined upper position above said squeezing unit within said second hermetically closed chamber, and supplies said fluid material onto said substrate surface via a clearance between a side wall of said second hermetically closed chamber and said squeezing unit.

6. The fluid material filling apparatus in accordance with claim 1, further comprising a depressurizing device for depressurizing said second hermetically closed chamber.

7. The fluid material filling apparatus in accordance with claim 6, wherein said second hermetically closed chamber is depressurized to a lower vacuum level compared with said first hermetically closed chamber.

8. The fluid material filling apparatus in accordance with claim 1, wherein said substrate has a plurality of holes, and said first hermetically closed chamber of said scavenging section and said second hermetically closed chamber of said fluid material filling section cause a shifting motion with respect to said substrate so as to stretch over an entire region including all of said plurality of holes, thereby filling said plurality of holes of the substrate with said fluid material.

9. The fluid material filling apparatus in accordance with claim 1, further comprising control means for controlling a depressurized condition of said scavenging section and also controlling a shifting condition of said shifting means, wherein said first hermetically closed chamber has an annular shape surrounding said second hermetically closed chamber, said control means shifts said first and second hermetically closed chambers to perform an initial fluid material filling operation for stuffing said fluid material into a hole of said substrate located in said first hermetically closed chamber under a condition that said first hermetically closed chamber is depressurized, and said control means relieves the depressurized condition of said first hermetically closed chamber and shifts said first and second hermetically closed chambers so as to again move on said hole having been once filled with said fluid material to perform a fluid material refilling operation for stuffing additional fluid material into said hole having been once filled with said fluid material.

10. The fluid material filling apparatus in accordance with claim 9, wherein said control means causes said first and second hermetically closed chambers to shift at a first speed during the initial fluid material filling operation, and then causes said first and second hermetically closed chambers to shift at a second speed higher than said first speed during the fluid material refilling operation.

11. The fluid material filling apparatus in accordance with claim 1, further comprising control means for controlling a depressurized condition of said scavenging section and also controlling a shifting condition of said shifting means, wherein said first hermetically closed chamber and said second hermetically closed chamber are aligned next to each other, said control means controls said shifting means so that said first hermetically closed chamber of said scavenging section and said second hermetically closed chamber of said fluid material filling section shift in both forward and backward directions on said substrate, said control means, in a forward stroke of said first and second hermetically closed chambers, highly depressurizes said first hermetically closed chamber located at a leading side of said second hermetically closed chamber and sets a shifting speed of said first and second hermetically closed chambers at a first speed, and said control means, in a backward stroke of said first and second hermetically closed chambers, relieves the depressurized condition of said first hermetically closed chamber located at a leading side or a trailing side of said second hermetically closed chamber and changes the shifting speed of said first and second hermetically closed chambers to a second speed higher than said first speed.

12. An apparatus for filling a plurality of holes of a substrate with a fluid material, comprising:

a first scavenging section for forming a first hermetically closed chamber when brought into contact with a substrate surface and for depressurizing said first hermetically closed chamber, and a second scavenging section for forming a second hermetically closed chamber when brought into contact with said substrate surface and for depressurizing said second hermetically closed chamber;

a fluid material filling section for forming a third hermetically closed chamber between said first and second hermetically closed chambers when brought into contact with said substrate surface and for stuffing said fluid material into the holes of said substrate within said third hermetically closed chamber;

shifting means for shifting said first hermetically closed chamber of said first scavenging section, said second hermetically closed chamber of said second scavenging section, and said third hermetically closed chamber of said fluid material filling section; and control means for controlling a depressurized condition of said first and second scavenging sections and also controlling a shifting condition of said shifting means, wherein said fluid material filling section comprises a supply section for supplying said fluid material onto a substrate surface within said third hermetically closed chamber and a squeezing unit for pushing said fluid material into the holes of said substrate within said third hermetically closed chamber, said control means controls said shifting means so that said first to third hermetically closed chambers shift in both forward and backward directions on said substrate, said control means, in a forward stroke of said first to third hermetically closed chambers, depressurizes the first hermetically closed chamber located at a leading side of said third hermetically closed chamber to a first depressurized condition and sets a shifting speed of said first to third hermetically closed chambers at a first speed, and said control means, in a backward stroke of said first to third hermetically closed chambers, depressurizes the second hermetically closed chamber located at a leading side of said third hermetically closed chamber to a second depressurized condition which is relieved than said first depressurized condition and changes the shifting speed of said first to third hermetically closed chambers to a second speed higher than said first speed being set in said forward stroke.

13. The fluid material filling apparatus in accordance with claim 12, wherein said control means, in said forward stroke, depressurizes the second hermetically closed chamber of said second scavenging section located at a trailing side of said third hermetically closed chamber of said fluid material filling section to a third depressurized condition which is relieved than said first depressurized condition.

14. The fluid material filling apparatus in accordance with claim 12, wherein said control means, in said backward stroke, depressurizes the first hermetically closed chamber of said first scavenging section located at a trailing side of said third hermetically closed chamber of said fluid material filling section to a fourth depressurized condition which is relieved than said second depressurized condition.

15. A filling method for filling a hole of a substrate with a fluid material, comprising:

a step of forming a first hermetically closed chamber partly defined by a predetermined region of a substrate surface and depressurizing said first hermetically closed chamber;

a step of forming a second hermetically closed chamber defined by a predetermined region of said substrate surface and positioned adjacent to said first hermetically closed chamber;

a step of supplying said fluid material onto a substrate surface within said second hermetically closed chamber; and a step of shifting said first and second hermetically closed chambers in a direction from said second hermetically closed chamber to said first hermetically closed chamber and pushing said fluid material supplied on said substrate surface by using a squeezing member into a hole of said substrate depressurized in said first hermetically closed chamber when said depressurized hole relocates into said second hermetically closed chamber.

16. The fluid material filling method in accordance with claim 15, wherein said squeezing member causes a motion selected from the group consisting of a rotational motion, an orbital motion, and a swing motion in said second hermetically closed chamber.

17. The fluid material filling method in accordance with claim 15, wherein said fluid material is held at a predetermined upper position above said squeezing member within said second hermetically closed chamber, and is supplied onto said substrate surface via a clearance between a side wall of said second hermetically closed chamber and said squeezing member.

18. The fluid material filling method in accordance with claim 15, further comprises a step of depressurizing said second hermetically closed chamber.

19. The fluid material filling method in accordance with claim 18, wherein said second hermetically closed chamber is depressurized to a lower vacuum level compared with said first hermetically closed chamber.

20. The fluid material filling method in accordance with claim 15, wherein said substrate has a plurality of holes, and said first and second hermetically closed chambers cause a shifting motion with respect to said substrate so as to stretch over an entire region including all of said plurality of holes, thereby filling said plurality of holes of the substrate with said fluid material.

21. The fluid material filling method in accordance with claim 15, wherein said first hermetically closed chamber has an annular shape surrounding said second hermetically closed chamber, an initial fluid material filling operation is performed by shifting said first and second hermetically closed chambers to stuff said fluid material into a hole of said substrate depressurized in said first hermetically closed chamber when said depressurized hole relocates into said second hermetically closed chamber, and a fluid material refilling operation is performed by relieving a depressurized condition of said first hermetically closed chamber to a level substantially equal to the atmospheric pressure and shifting said first and second hermetically closed chambers to stuff additional fluid material into the hole having been once filled with said fluid material under such a relieved pressure condition.

22. The fluid material filling method in accordance with claim 21, wherein said first and second hermetically closed chambers are shifted at a first speed during the initial fluid material filling operation, and then said first and second hermetically closed chambers are shifted at a second speed higher than said first speed during the fluid material refilling operation.

23. The fluid material filling method in accordance with claim 15, wherein said first hermetically closed chamber and said second hermetically closed chamber are aligned next to each other, and are shifted in both forward and backward directions on said substrate during the step of pushing said fluid material into the depressurized hole of said substrate, in a forward stroke of said first and second hermetically closed chambers, said first hermetically closed chamber located at a leading side of said second hermetically closed chamber is highly depressurized and a shifting speed of said first and second hermetically closed chambers is set to a first speed, and in a backward stroke of said first and second hermetically closed chambers, the depressurized condition of said first hermetically closed chamber located at a leading side or a trailing side of said second hermetically closed chamber is relieved and the shifting speed of said first and second hermetically closed chambers is set to a second speed higher than said first speed.

24. A filling method for filling a plurality of holes of a substrate with a fluid material, comprising:

a step of forming a first hermetically closed chamber partly defined by a predetermined region of a substrate, forming a second hermetically closed chamber partly defined by a predetermined region of the substrate, and a third hermetically closed chamber between said first and second hermetically closed chambers partly defined by a predetermined region of the substrate;

a step of supplying said fluid material onto a substrate surface within said third hermetically closed chamber;

a step of performing an initial fluid material filling operation for depressurizing said first hermetically closed chamber to a first depressurized condition and shifting said first to third hermetically closed chambers at a first speed in a direction from said third hermetically closed chamber to said first hermetically closed chamber so as to stuff said fluid material on said substrate surface into holes of said substrate depressurized in said first hermetically closed chamber when said depressurized holes relocate into said third hermetically closed chamber; and a step of performing a fluid material refilling operation for depressurizing said second hermetically closed chamber to a second depressurized condition relieved than said first depressurized condition and shifting said first to third hermetically closed chambers in a direction from said third hermetically closed chamber to said second hermetically closed chamber at a second speed higher than said first speed so as to stuff the fluid material on said substrate surface into the holes of said substrate depressurized in said second hermetically closed chamber when said depressurized holes relocate into said third hermetically closed chamber.

25. The fluid material filling method in accordance with claim 24, wherein during said initial fluid material filling operation said second hermetically closed chamber located at a trailing side of said third hermetically closed chamber is depressurized into a third depressurized condition which is relieved than said first depressurized condition.

26. The fluid material filling method in accordance with claim 24, wherein during said fluid material refilling operation said first hermetically closed chamber located at a trailing side of said third hermetically closed chamber is depressurized into a fourth depressurized condition which is relieved than said second depressurized condition.

* * * * *